(12) United States Patent
Wang et al.

(10) Patent No.: US 12,290,005 B2
(45) Date of Patent: *Apr. 29, 2025

(54) MAGNETORESISTIVE RANDOM ACCESS MEMORY

(71) Applicant: UNITED MICROELECTRONICS CORP., Hsin-Chu (TW)

(72) Inventors: Hui-Lin Wang, Taipei (TW); Yu-Ping Wang, Hsinchu (TW); Chen-Yi Weng, New Taipei (TW); Chin-Yang Hsieh, Tainan (TW); Si-Han Tsai, Taichung (TW); Che-Wei Chang, Taichung (TW); Jing-Yin Jhang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/679,437

(22) Filed: May 30, 2024

(65) Prior Publication Data
US 2024/0324472 A1 Sep. 26, 2024

Related U.S. Application Data

(63) Continuation of application No. 18/202,275, filed on May 25, 2023, now Pat. No. 12,029,139, which is a continuation of application No. 17/463,541, filed on Aug. 31, 2021, now Pat. No. 11,706,996, which is a continuation of application No. 16/589,083, filed on Sep. 30, 2019, now Pat. No. 11,139,428.

(30) Foreign Application Priority Data

Sep. 3, 2019 (CN) .......................... 201910827096.1

(51) Int. Cl.
| | | |
|---|---|---|
| H10N 50/80 | (2023.01) | |
| H10B 61/00 | (2023.01) | |
| H10N 50/85 | (2023.01) | |
| H10N 50/01 | (2023.01) | |

(52) U.S. Cl.
CPC ............. *H10N 50/80* (2023.02); *H10B 61/00* (2023.02); *H10N 50/85* (2023.02); *H10N 50/01* (2023.02)

(58) Field of Classification Search
CPC ........ H10N 50/80; H10N 50/01; H10N 50/85; H10N 50/10; H10B 61/00; H10B 61/22; G11C 11/161
See application file for complete search history.

(56) References Cited

U.S. PATENT DOCUMENTS

| | | | |
|---|---|---|---|
| 9,711,713 B1 | 7/2017 | Chou | |
| 10,510,802 B2 * | 12/2019 | Chuang | .................. H10N 50/01 |
| 10,529,920 B1 * | 1/2020 | Feng | ....................... H10N 50/80 |

(Continued)

FOREIGN PATENT DOCUMENTS

CN 109979961 A 7/2019

*Primary Examiner* — Victor A Mandala
(74) *Attorney, Agent, or Firm* — Winston Hsu

(57) ABSTRACT

A semiconductor device includes: a substrate comprising a magnetic tunneling junction (MTJ) region and a logic region; a first MTJ on the MTJ region; a first metal interconnection on the logic region; and a cap layer extending from a sidewall of the first MTJ to a sidewall of the first metal interconnection. Preferably, the cap layer on the MTJ region and the cap layer on the logic region comprise different thicknesses.

8 Claims, 9 Drawing Sheets

(56) References Cited

U.S. PATENT DOCUMENTS

| | | | |
|---|---|---|---|
| 10,804,320 B2* | 10/2020 | Han | H10B 61/10 |
| 10,840,432 B2* | 11/2020 | Wang | H01F 10/3254 |
| 10,957,850 B2* | 3/2021 | Dutta | H10N 50/85 |
| 11,706,996 B2* | 7/2023 | Wang | H10B 61/00 257/421 |
| 12,029,139 B2* | 7/2024 | Wang | H10N 50/80 |
| 12,127,489 B2* | 10/2024 | Peng | H10B 63/82 |
| 2008/0198647 A1* | 8/2008 | Kanakasabapathy | H10N 50/01 365/171 |
| 2012/0228728 A1* | 9/2012 | Ueki | H10N 50/10 257/E29.323 |
| 2014/0264679 A1* | 9/2014 | Lee | H10N 50/10 257/427 |
| 2016/0268336 A1 | 9/2016 | Shum | |
| 2016/0351797 A1 | 12/2016 | Yi | |
| 2017/0047374 A1* | 2/2017 | Lu | H10B 61/00 |
| 2017/0053967 A1 | 2/2017 | Chuang | |
| 2017/0194557 A1* | 7/2017 | Chuang | H10B 61/22 |
| 2017/0301728 A1* | 10/2017 | Chuang | H10N 50/80 |
| 2018/0166501 A1 | 6/2018 | Chuang | |
| 2018/0301505 A1* | 10/2018 | Chuang | H01L 23/5226 |
| 2018/0350875 A1* | 12/2018 | Han | H10N 50/80 |
| 2018/0374895 A1* | 12/2018 | Hsu | H10N 50/01 |
| 2019/0088656 A1* | 3/2019 | Kim | H10B 61/22 |
| 2019/0096753 A1* | 3/2019 | Lin | H10N 50/80 |
| 2019/0131346 A1 | 5/2019 | Lin | |
| 2019/0140018 A1* | 5/2019 | Kalnitsky | G11C 11/161 |
| 2019/0165041 A1* | 5/2019 | Chuang | H10B 61/22 |
| 2019/0165258 A1 | 5/2019 | Peng | |
| 2019/0229261 A1* | 7/2019 | Hsieh | H10N 50/01 |
| 2020/0035908 A1* | 1/2020 | Ku | H01F 41/34 |
| 2020/0083428 A1* | 3/2020 | Weng | H01F 41/307 |
| 2020/0098982 A1* | 3/2020 | Chuang | H10B 61/22 |
| 2020/0111950 A1* | 4/2020 | Chen | H10B 61/00 |
| 2020/0136014 A1* | 4/2020 | Wang | G11C 11/161 |
| 2020/0144490 A1* | 5/2020 | Weng | H10N 50/80 |
| 2020/0227473 A1* | 7/2020 | Lee | H10B 61/00 |
| 2020/0266335 A1* | 8/2020 | Wang | H10B 61/22 |
| 2020/0303623 A1* | 9/2020 | Wiegand | H10B 61/22 |
| 2020/0328251 A1* | 10/2020 | Dutta | H01L 23/53209 |
| 2020/0357850 A1* | 11/2020 | Huang | H10N 50/80 |
| 2020/0388648 A1* | 12/2020 | Kuo | H10B 61/22 |
| 2020/0411591 A1* | 12/2020 | Han | H10B 61/10 |
| 2021/0013395 A1* | 1/2021 | Kuo | H10N 70/826 |
| 2021/0028350 A1* | 1/2021 | Ku | H01L 23/5283 |
| 2021/0035620 A1* | 2/2021 | Wang | H10N 50/10 |
| 2021/0043683 A1* | 2/2021 | Chiang | G11C 11/1659 |
| 2023/0413579 A1* | 12/2023 | Kuo | H10B 61/22 |

* cited by examiner

MAGNETORESISTIVE RANDOM ACCESS MEMORY

CROSS REFERENCE TO RELATED APPLICATIONS

This application is a continuation application of U.S. application Ser. No. 18/202,275, filed on May 25, 2023, which is a continuation application of U.S. application Ser. No. 17/463,541, filed on Aug. 31, 2021, which is a continuation application of U.S. application Ser. No. 16/589,083, filed on Sep. 30, 2019. The contents of these applications are incorporated herein by reference.

BACKGROUND OF THE INVENTION

1. Field of the Invention

The invention relates to a semiconductor device, and more particularly, to a magnetoresistive random access memory (MRAM).

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. Currently, MR effect has been successfully utilized in production of hard disks thereby having important commercial values. Moreover, the characterization of utilizing GMR materials to generate different resistance under different magnetized states could also be used to fabricate MRAM devices, which typically has the advantage of keeping stored data even when the device is not connected to an electrical source.

The aforementioned MR effect has also been used in magnetic field sensor areas including but not limited to for example electronic compass components used in global positioning system (GPS) of cellular phones for providing information regarding moving location to users. Currently, various magnetic field sensor technologies such as anisotropic magnetoresistance (AMR) sensors, GMR sensors, magnetic tunneling junction (MTJ) sensors have been widely developed in the market. Nevertheless, most of these products still pose numerous shortcomings such as high chip area, high cost, high power consumption, limited sensibility, and easily affected by temperature variation and how to come up with an improved device to resolve these issues has become an important task in this field.

SUMMARY OF THE INVENTION

According to an embodiment of the present invention, a semiconductor device includes: a substrate comprising a magnetic tunneling junction (MTJ) region and a logic region; a first MTJ on the MTJ region; a first metal interconnection on the logic region; and a cap layer extending from a sidewall of the first MTJ to a sidewall of the first metal interconnection. Preferably, the cap layer on the MTJ region and the cap layer on the logic region comprise different thicknesses.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
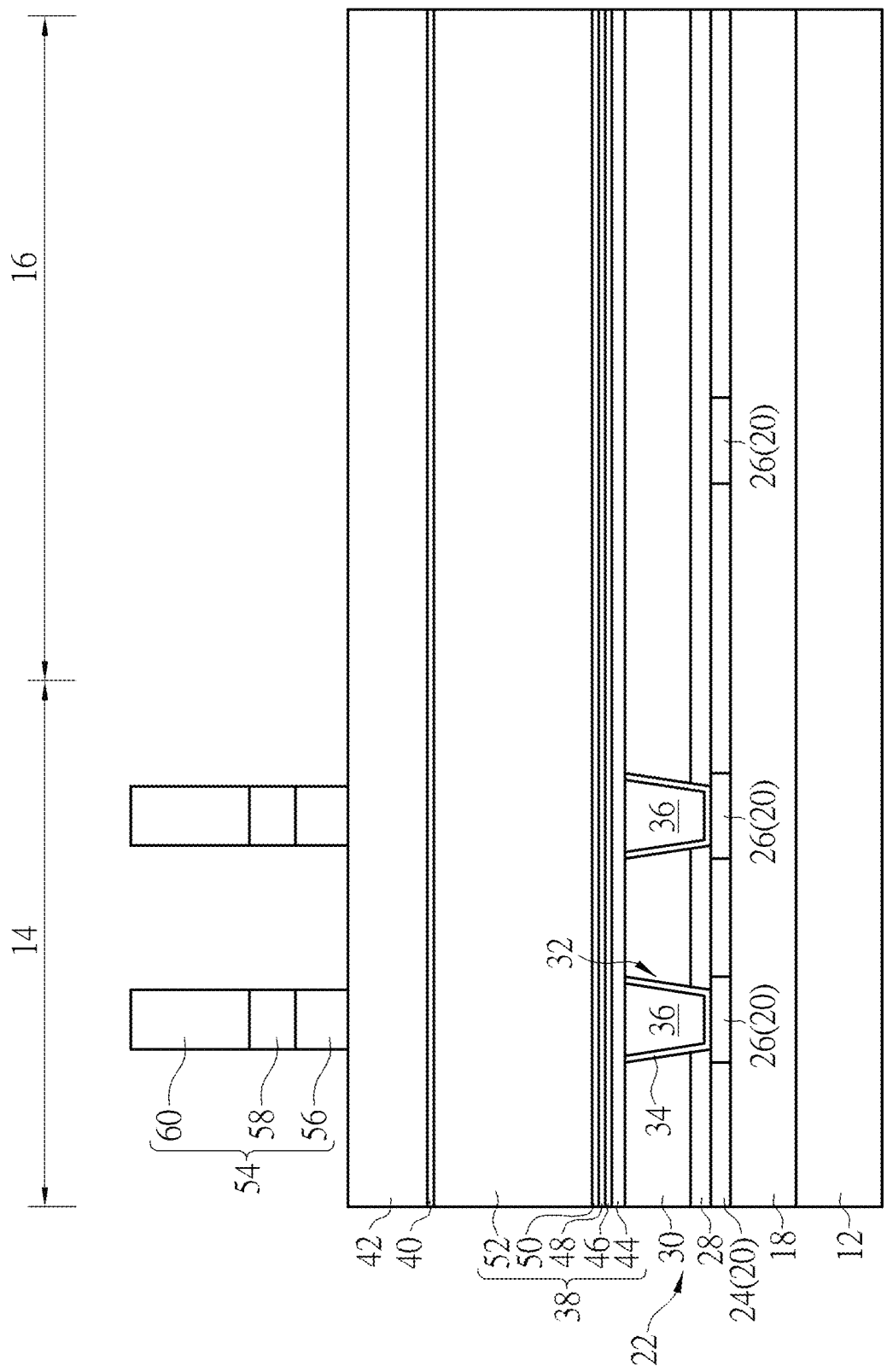
FIGS. 1-7 illustrate a method for fabricating a semiconductor device according to an embodiment of the present invention.

Referring to FIGS. 1-7, FIGS. 1-7 illustrate a method for fabricating a semiconductor device, or more specifically a MRAM device according to an embodiment of the present invention. As shown in FIG. 1, a substrate 12 made of semiconductor material is first provided, in which the semiconductor material could be selected from the group consisting of silicon (Si), germanium (Ge), Si—Ge compounds, silicon carbide (SiC), and gallium arsenide (GaAs), and a MTJ region 14 and a logic region 16 are defined on the substrate 12.

Active devices such as metal-oxide semiconductor (MOS) transistors, passive devices, conductive layers, and interlayer dielectric (ILD) layer 18 could also be formed on top of the substrate 12. More specifically, planar MOS transistors or non-planar (such as FinFETs) MOS transistors could be formed on the substrate 12, in which the MOS transistors could include transistor elements such as gate structures (for example metal gates) and source/drain region, spacer, epitaxial layer, and contact etch stop layer (CESL). The ILD layer 18 could be formed on the substrate 12 to cover the MOS transistors, and a plurality of contact plugs could be formed in the ILD layer 18 to electrically connect to the gate structure and/or source/drain region of MOS transistors. Since the fabrication of planar or non-planar transistors and ILD layer is well known to those skilled in the art, the details of which are not explained herein for the sake of brevity.

Next, metal interconnect structures 20, 22 are sequentially formed on the ILD layer 18 on the MTJ region 14 and the edge region 16 to electrically connect the aforementioned contact plugs, in which the metal interconnect structure 20 includes an inter-metal dielectric (IMD) layer 24 and metal interconnections 26 embedded in the IMD layer 24, and the metal interconnect structure 22 includes a stop layer 28, an IMD layer 30, and metal interconnections 32 embedded in the stop layer 28 and the IMD layer 30.

In this embodiment, each of the metal interconnections 26 from the metal interconnect structure 20 preferably includes a trench conductor and each of the metal interconnections 32 from the metal interconnect structure 22 on the MTJ region 14 includes a via conductor. Preferably, each of the metal interconnections 26, 32 from the metal interconnect structures 20, 22 could be embedded within the IMD layers 24, 30 and/or stop layer 28 according to a single damascene process or dual damascene process. For instance, each of the metal interconnections 26, 32 could further includes a barrier layer 34 and a metal layer 36, in which the barrier layer 34 could be selected from the group consisting of titanium (Ti), titanium nitride (TiN), tantalum (Ta), and tantalum nitride (TaN) and the metal layer 36 could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. In this embodiment, the metal layers 36 are preferably made of copper, the IMD layers 24, 30 are preferably made of silicon oxide, and the stop layers 28 is preferably made of nitrogen doped carbide (NDC), silicon nitride, silicon carbon nitride (SiCN), or combination thereof.

Next, a MTJ stack 38 or stack structure is formed on the metal interconnect structure 22, a cap layer 40 is formed on the MTJ stack 38, and another cap layer 42 formed on the cap layer 40. In this embodiment, the formation of the MTJ stack 38 could be accomplished by sequentially depositing a first electrode layer 44, a fixed layer 46, a barrier layer 48, a free layer 50, and a second electrode layer 52 on the IMD layer 30. In this embodiment, the first electrode layer 44 and the second electrode layer 52 are preferably made of conductive material including but not limited to for example Ta, Pt, Cu, Au, Al, or combination thereof. The fixed layer 46 could be made of antiferromagnetic (AFM) material including but not limited to for example ferromanganese (FeMn), platinum manganese (PtMn), iridium manganese (IrMn), nickel oxide (NiO), or combination thereof, in which the fixed layer 46 is formed to fix or limit the direction of magnetic moment of adjacent layers. The barrier layer 48 could be made of insulating material including but not limited to for example oxides such as aluminum oxide ($AlO_x$) or magnesium oxide (MgO). The free layer 50 could be made of ferromagnetic material including but not limited to for example iron, cobalt, nickel, or alloys thereof such as cobalt-iron-boron (CoFeB), in which the magnetized direction of the free layer 50 could be altered freely depending on the influence of outside magnetic field. Preferably, the cap layer 40 and cap layer 42 are made of different materials. For instance, the cap layer 40 is preferably made of silicon nitride and the cap layer 42 is made of silicon oxide, but not limited thereto.

Next, a patterned mask 54 is formed on the cap layer 42. In this embodiment, the patterned mask 54 could include an organic dielectric layer (ODL) 56, a silicon-containing hard mask bottom anti-reflective coating (SHB) 58, and a patterned resist 60.

Figure 2:
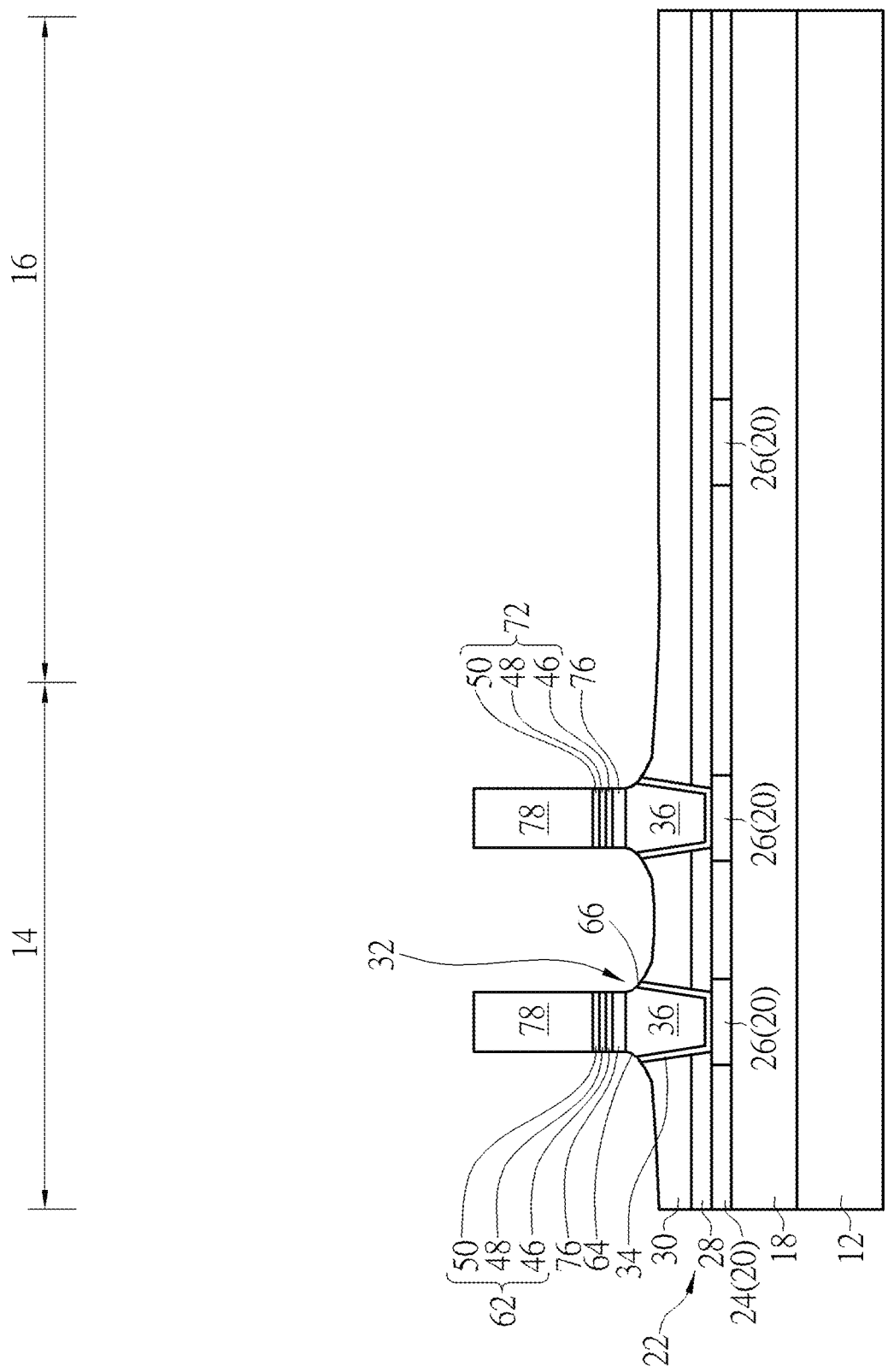

Next, as shown in FIG. 2, one or more etching process is conducted by using the patterned mask 54 as mask to remove part of the cap layers 40, 42, part of the MTJ stack 38, and part of the IMD layer 30 to form MTJ 62 and MTJ 72 on the MTJ region 14, in which the first electrode layer 44 at this stage preferably becomes a bottom electrode 76 for the MTJs 62, 72 while the second electrode layer 52 becomes a top electrode 78 for the MTJs 62, 72 and the cap layers 40, 42 could be removed during the etching process. It should be noted that this embodiment preferably conducts a reactive ion etching (RIE) process by using the patterned mask 54 as mask to remove part of the cap layers 40, 42 and part of the MTJ stack 38, strips the patterned mask 54, and then conducts an ion beam etching (IBE) process by using the patterned cap layer 42 as mask to remove part of the MTJ stack 38 and part of the IMD layer 30 to form MTJs 62, 72. Due to the characteristics of the IBE process, the top surface of the remaining IMD layer 30 is slightly lower than the top surface of the metal interconnections 32 after the IBE process and the top surface of the IMD layer 30 also reveals a curve or an arc.

It should also be noted that when the IBE process is conducted to remove part of the IMD layer 30, part of the metal interconnections 32 are removed at the same time so that a first slanted sidewall 64 and a second slanted sidewall 66 are formed on the metal interconnections 32 adjacent to the MTJ 62, in which each of the first slanted sidewall 64 and the second slanted sidewall 66 could further include a curve (or curved surface) or a planar surface.

Figure 3:
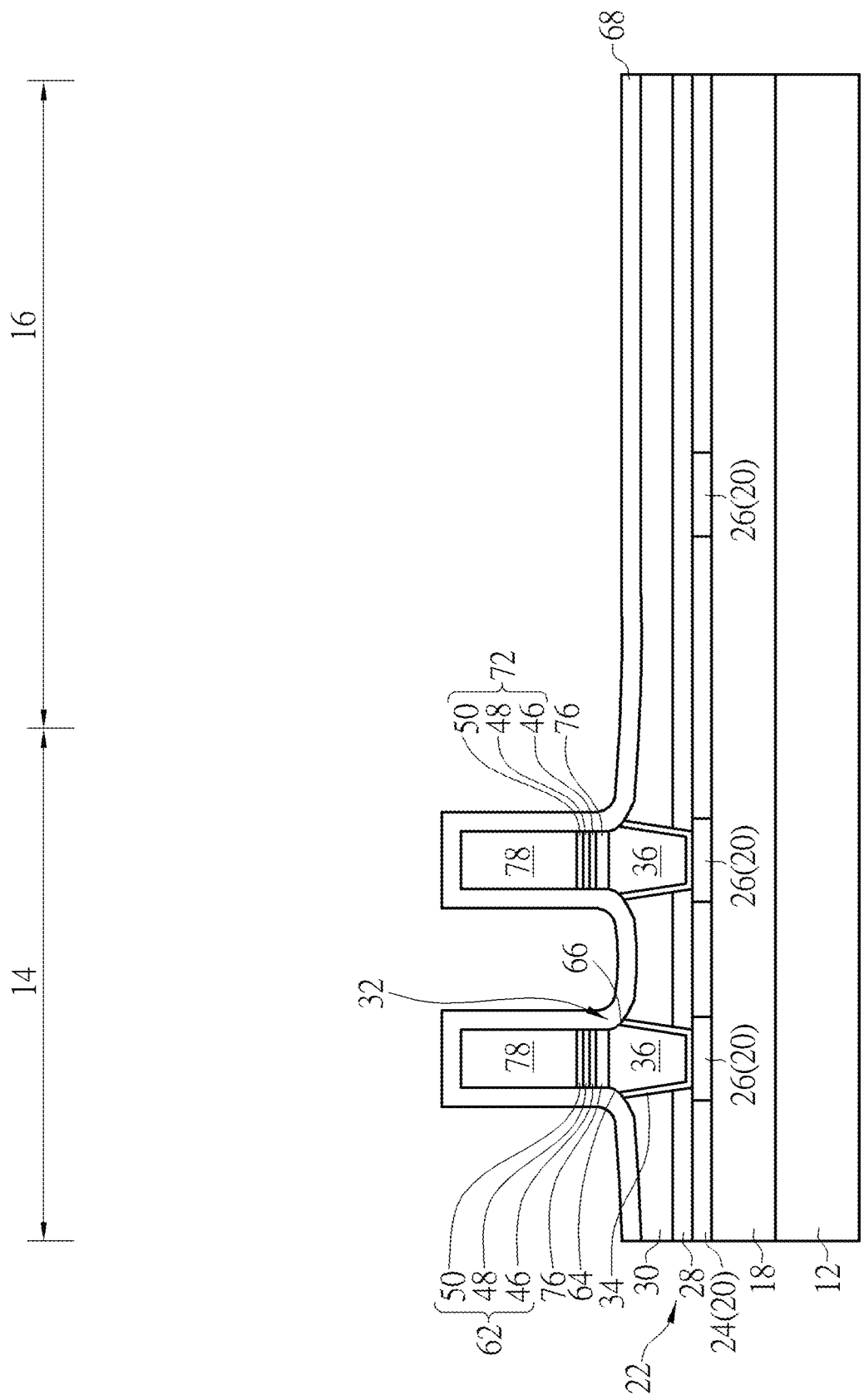

Next, as shown in FIG. 3, a cap layer 68 is formed on the MTJ 62, 72 to cover the surface of the IMD layer 30. In this embodiment, the cap layer 68 is preferably made of silicon nitride, but could also be made of other dielectric material including but not limited to for example silicon oxide, silicon oxynitride, or silicon carbon nitride.

Figure 4:
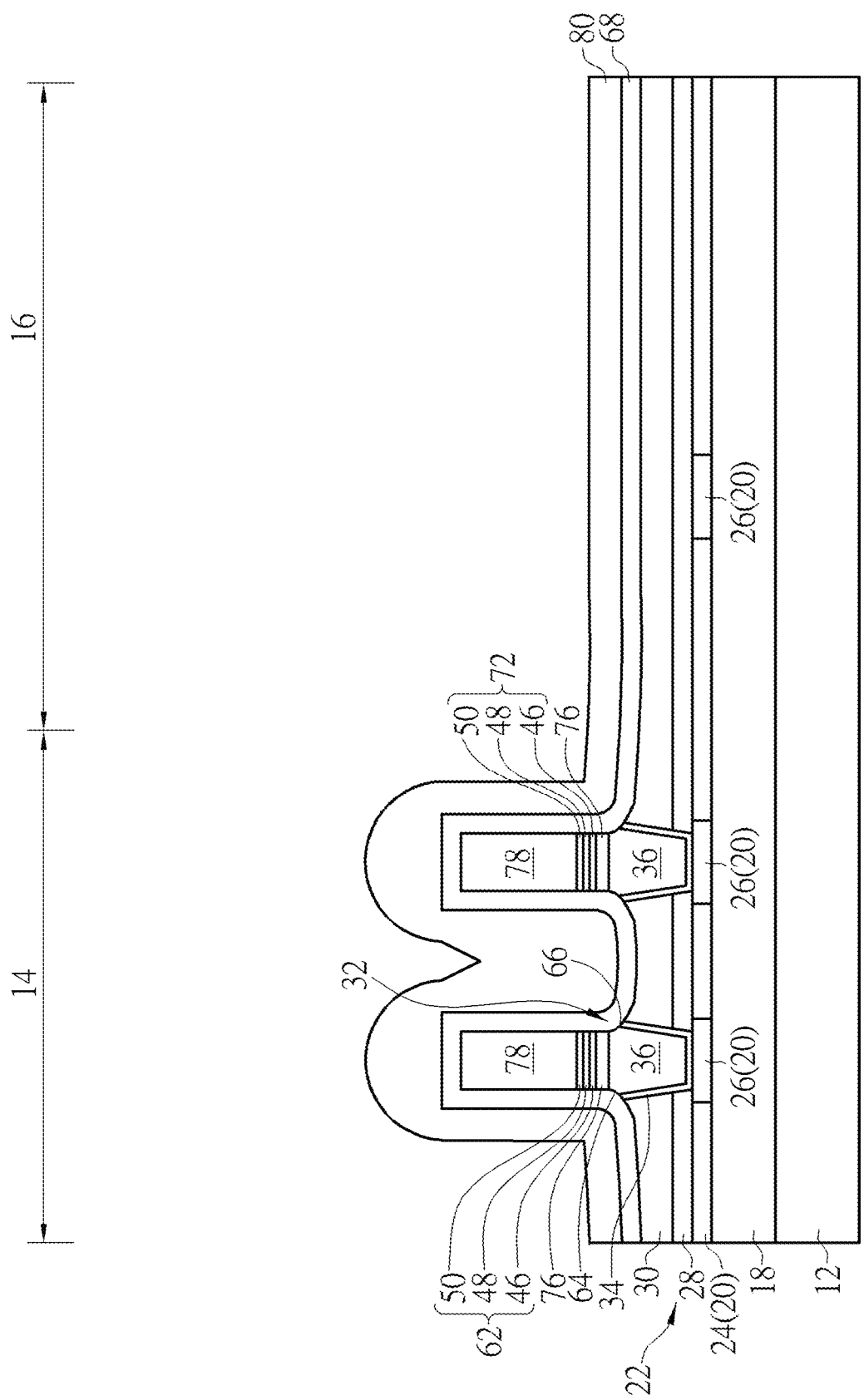

Next, as shown in FIG. 4, an atomic layer deposition (ALD) process is conducted to form a passivation layer 80 on the surface of the cap layer 68 to fully cover the MTJs 62, 72, in which the passivation layer 80 preferably includes silicon oxide and the topmost surface of the passivation layer 80 is higher than the top surface of the top electrodes 78. It should be noted that the cap layer 68 disposed on both the MTJ region 14 and logic region 16 at this stage still has an even thickness or that the thickness of the cap layer 68 on the MTJ region 14 is equal to the thickness of the cap layer 68 on the logic region 16.

Figure 5:
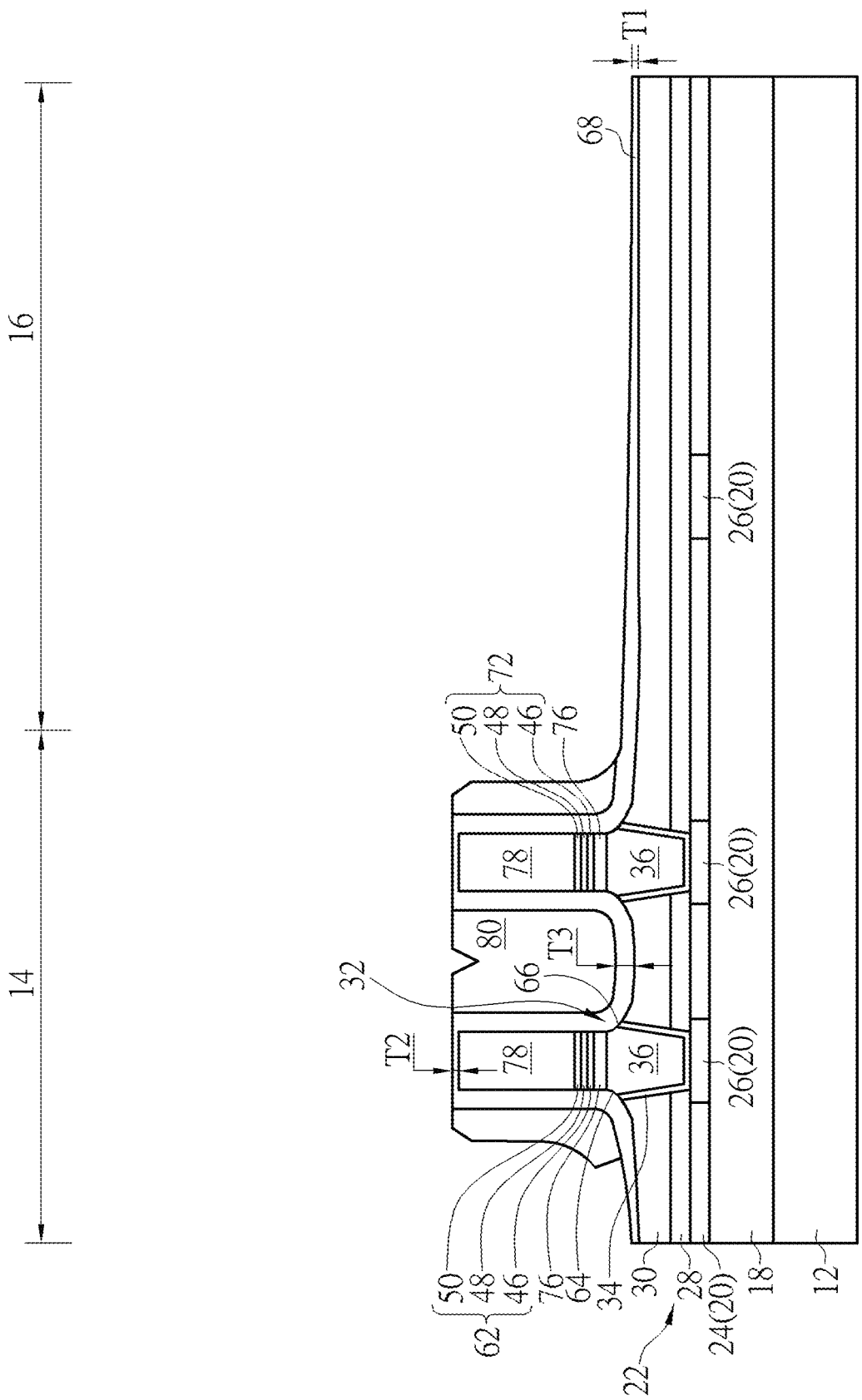

Next, as shown in FIG. 5, an etching back process is conducted to remove part of the passivation layer 80 and even part of the cap layer 68 so that the top surface of the remaining passivation layer 80 is even with the top surface of the remaining cap layer 68. Specifically, an etching process is conducted by using the selectivity between the passivation layer 80 and cap layer 68 without forming any patterned mask at this stage to remove part of the passivation layer 80 and part of the cap layer 68, in which the passivation layer 80 being removed includes part of the passivation layer 80 on both MTJ region 14 and logic region 16 while the cap layer 68 being removed includes part of the cap layer 68 directly on top of the top electrodes 78 and part of the cap layer 68 on the logic region 16 excepting part of the cap layer 68 between the MTJs 62, 72. Since some of the cap layer 68 on the MTJ region 14 is removed during the etching process while some of the cap layer 68 on the same region 14 is not removed, the remaining cap layer 68 after the etching process preferably includes at least two thicknesses. For instance, the thinnest portion of the cap layer 68 adjacent to two sides of the remaining passivation layer 80 on the logic region 16 includes a first thickness T1, the cap layer 68 directly on top of the top electrodes 78 includes a second thickness T2, and the cap layer 68 between the MTJs 62, 72 includes a third thickness T3. Specifically, the first thickness T1 could be the same as or different from the second thickness T2, while each of the first thickness T1 and the second thickness T2 is less than the third thickness T3, in which each of the first thickness T1 and/or the second thickness T2 is preferably between 50-150 Angstroms and the third thickness T3 is between 50-250 Angstroms.

It should also be noted that after part of the passivation layer 80 is removed by the aforementioned etching back process the remaining passivation layer 80 still surrounds the MTJs 62, 72, in which the top surface of the passivation layer 80 between the MTJs 62, 72 preferably includes a V-shape, the V-shape is lower than the top surface of the top electrodes 78, and the angle included by the V-shape is greater than 100 degrees but could also be less than 100 degrees depending on the demand of the process.

Figure 6:
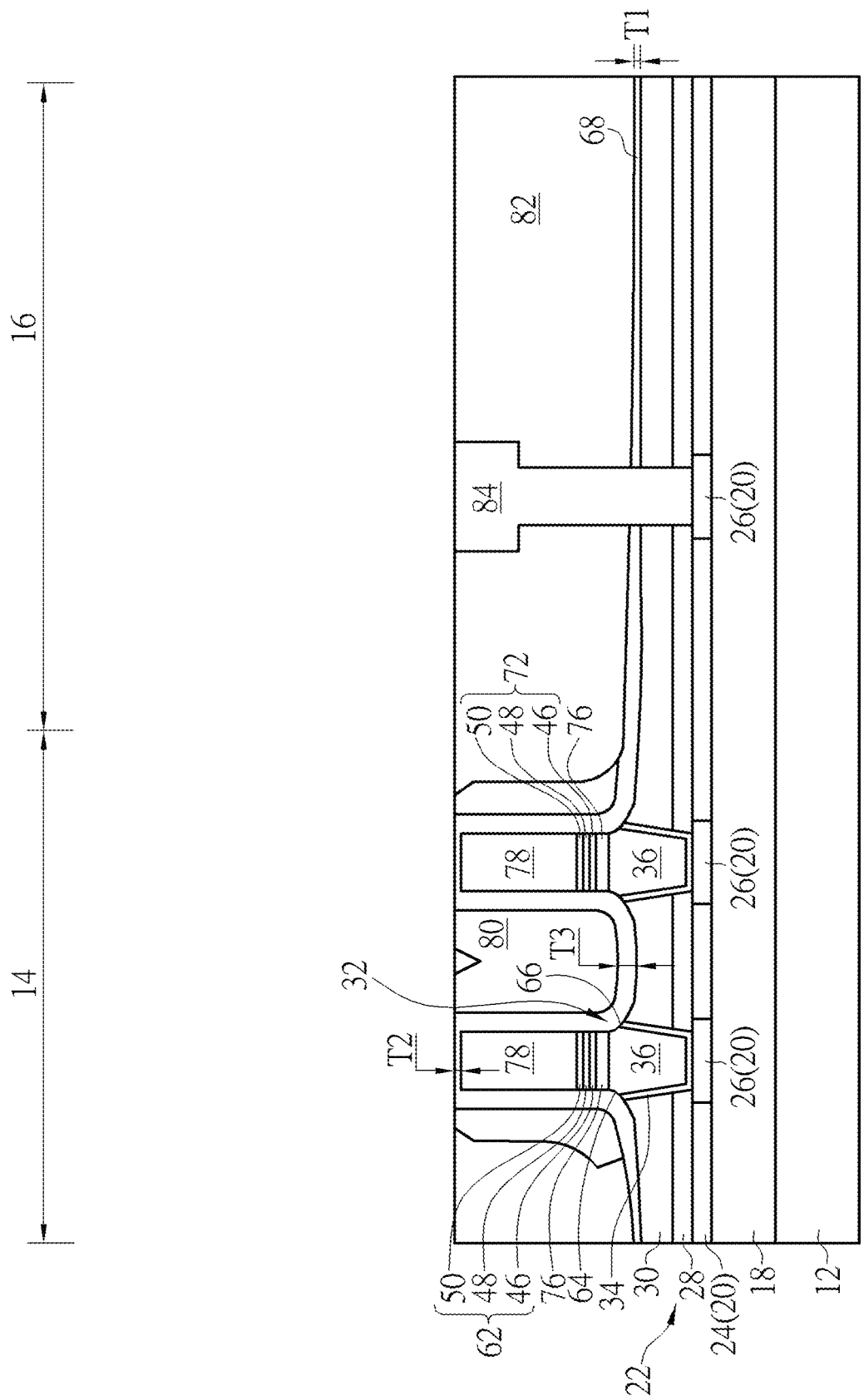

Next, as shown in FIG. 6, another IMD layer 82 is formed on the MTJ region 14 and logic region 16, and a planarizing process such as CMP is conducted to remove part of the IMD layer 82 so that the top surface of the IMD layer 82 is even with the top surface of the passivation layer 80. Next, a pattern transfer process is conducted by using a patterned mask (not shown) to remove part of the IMD layer 82, part of the cap layer 68, part of the IMD layer 30, and part of the stop layer 28 on the logic region 16 to form a contact hole (not shown) exposing the metal interconnection 26 underneath and conductive materials are deposited into the contact hole afterwards. For instance, a barrier layer selected from the group consisting of titanium (Ti), titanium nitride (TiN), tantalum (Ta), and tantalum nitride (TaN) and metal layer selected from the group consisting of tungsten (W), copper (Cu), aluminum (Al), titanium aluminide (TiAl), and cobalt tungsten phosphide (CoWP) could be deposited into the contact hole, and a planarizing process such as CMP could be conducted to remove part of the conductive materials including the aforementioned barrier layer and metal layer to form a contact plug or metal interconnection 84 in the contact hole electrically connecting the metal interconnection 26.

Figure 7:
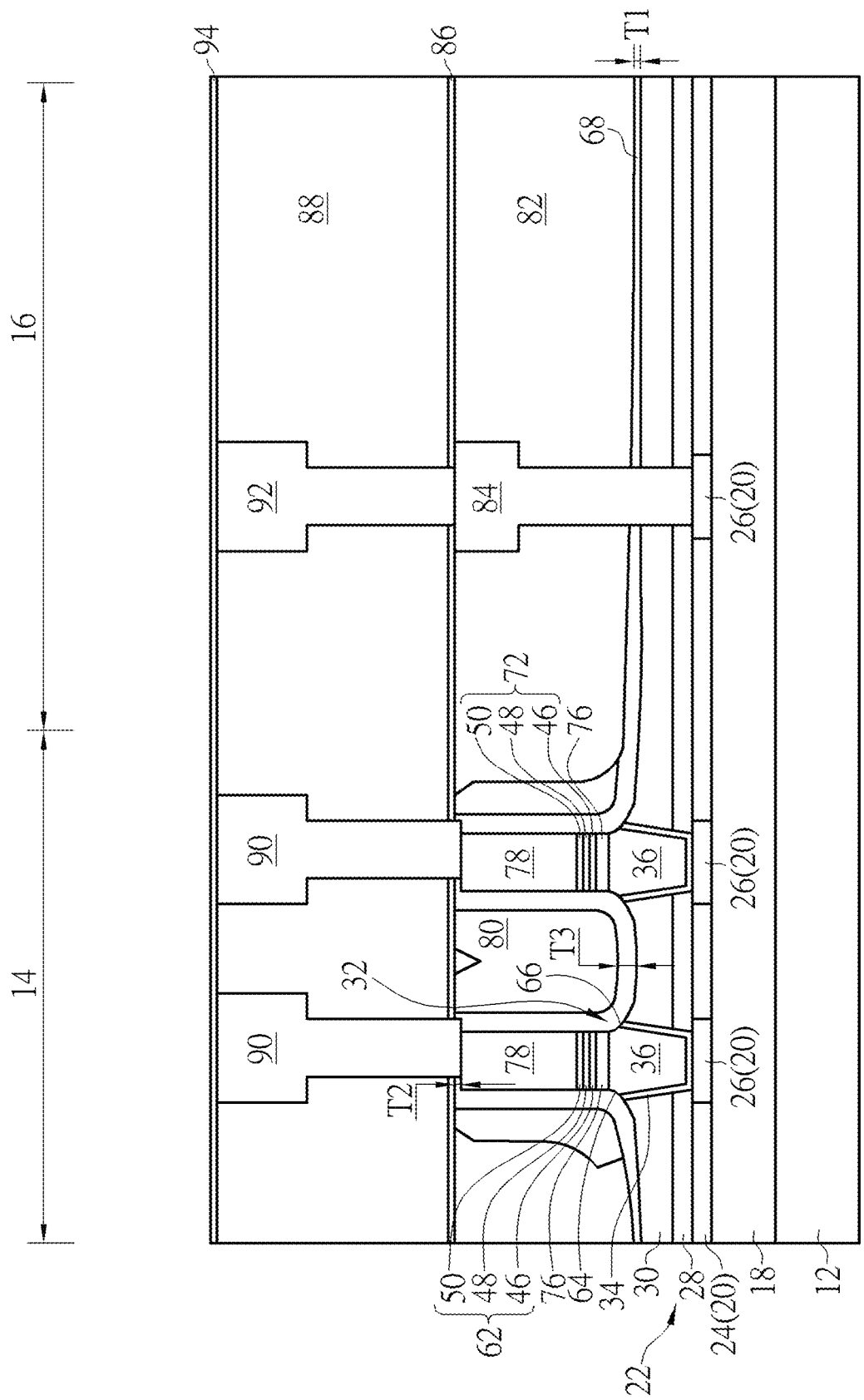

Next, as shown in FIG. 7, a stop layer 86 and another IMD layer 88 are formed on the MTJs 62, 72 to cover the surface of the IMD layer 82, and one or more photo-etching process is conducted to remove part of the IMD layer 88, part of the stop layer 86, and even part of the cap layer 68 on the MTJ region 14 and part of the IMD layer 88 and part of the stop layer 86 on the logic region 16 to form contact holes (not shown). Next, conductive materials are deposited into each of the contact holes and a planarizing process such as CMP is conducted to form metal interconnections 90, 92 directly connecting the top electrodes 78 and metal interconnection 84 underneath, in which the metal interconnection 90 on the MTJ region 14 directly contacts the top electrodes 78 underneath while the metal interconnection 92 on the logic region 16 directly contacts the metal interconnection 84 on the lower level. Next, another stop layer 94 is formed on the IMD layer 88 to cover the metal interconnections 90, 92.

In this embodiment, the stop layer 86 and the stop layer 28 could be made of same material or different material. For example, both layers 82, 28 could include nitrogen doped carbide (NDC), silicon nitride, silicon carbon nitride (SiCN), or combination thereof. Similar to the metal interconnections formed previously, each of the metal interconnections 90, 92 could be formed in the IMD layer 88 through a single damascene or dual damascene process. For instance, each of the metal interconnections 90, 92 could further include a barrier layer and a metal layer, in which the barrier layer could be selected from the group consisting of titanium (Ti), titanium nitride (TiN), tantalum (Ta), and tantalum nitride (TaN) and the metal layer could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. This completes the fabrication of a semiconductor device according to an embodiment of the present invention.

Referring to FIG. 7, FIG. 7 further illustrates a structural view of a semiconductor device according to an embodiment of the present invention. As shown in FIG. 7, the semiconductor device preferably includes MTJs 62, 72 disposed on the MTJ region 14, a metal interconnection 84 disposed on the logic region 16, metal interconnections 32 disposed directly under the MTJs 62, 72, an IMD layer 30 disposed around the metal interconnections 32, a cap layer 68 extending from on a sidewall of the MTJ 72 to a sidewall of the metal interconnection 84, a passivation layer 80 on the cap layer 68 and surrounding the MTJs 62, 72, an IMD layer 82 disposed on the cap layer 68 and surround the passivation layer 80, another IMD layer 88 disposed on the IMD layer 82, and metal interconnections 90, 92 disposed in the IMD layer 88 to electrically connect the top electrodes 78 and metal interconnection 84 underneath.

In this embodiment, the cap layer 68 disposed on the MTJ region 14 and the cap layer 68 disposed on the logic region 16 preferably includes different thicknesses, or more specifically a thickness of the cap layer 68 disposed on the IMD layer 30 on the logic region 16 is preferably less than a thickness of the cap layer 68 disposed on the IMD layer 30 between the MTJs 62, 72. Viewing from a more detailed perspective, the thinnest portion of the cap layer 68 adjacent to two sides of the passivation layer 80 on the logic region 16 includes a first thickness T1, the cap layer 68 directly on top of the top electrodes 78 includes a second thickness T2, and the cap layer 68 on sidewalls of the MTJs 62, 72 and/or the cap layer 68 directly on top of the IMD layer 30 between the MTJs 62, 72 includes a third thickness T3, in which the first thickness T1 could be the same as or different from the second thickness T2 while each of the first thickness T1 and the second thickness T2 is less than the third thickness T3. In this embodiment, each of the first thickness T1 and/or the second thickness T2 is preferably between 50-150 Angstroms and the third thickness T3 is between 50-250 Angstroms. Moreover, the top surfaces of the IMD layer 32, passivation layer 80, cap layer 68, and metal interconnection 84 are coplanar and the passivation layer 80 and IMD layer 82 are preferably made of different materials, in which the passivation layer 80 preferably includes while the IMD layer 82 could include a ultra low-k (ULK) dielectric layer such as porous dielectric materials including but not limited to for example silicon oxycarbide (SiOC).

Figure 8:
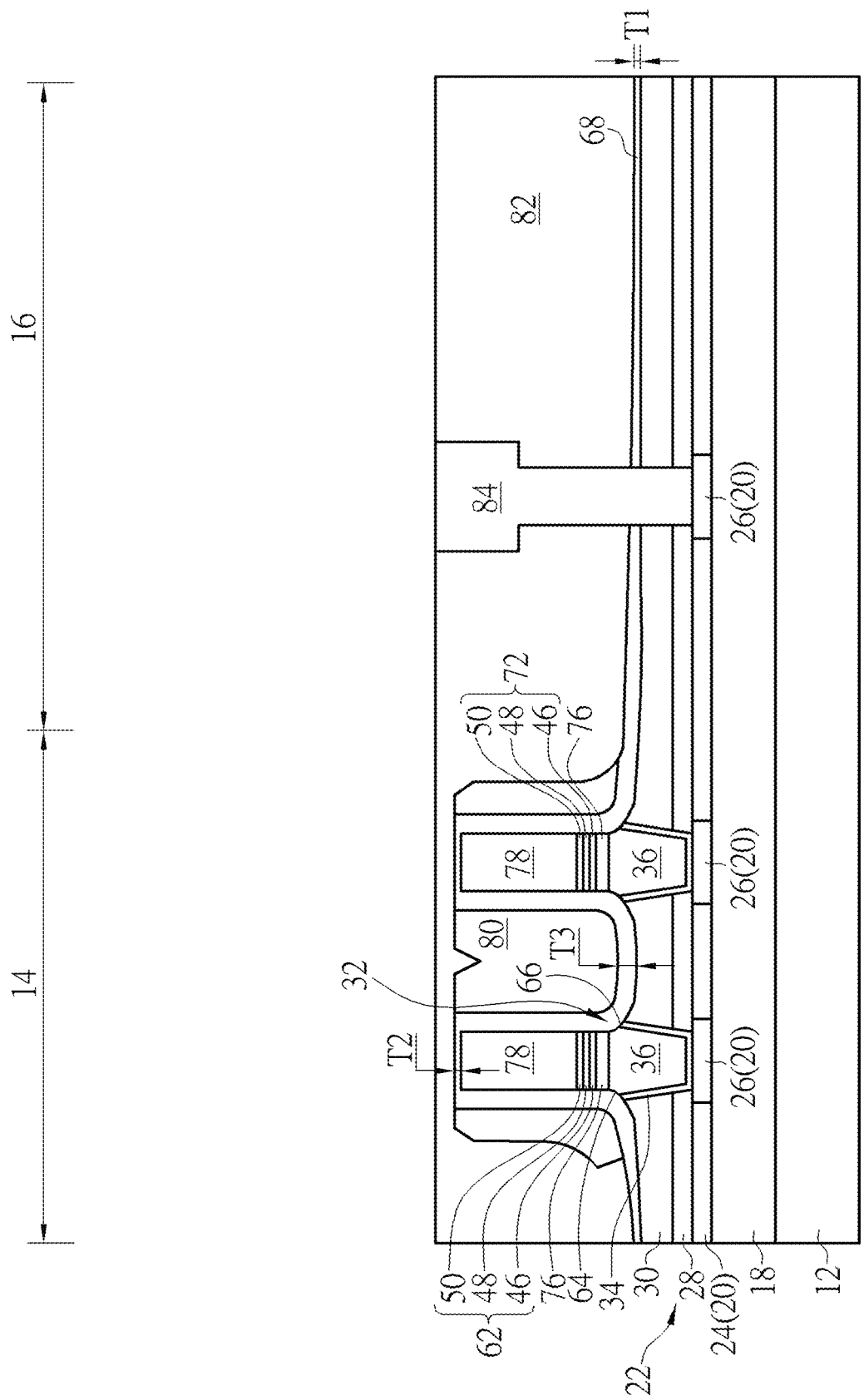
FIGS. 8-9 illustrate a method for fabricating semiconductor device according to an embodiment of the present invention.
Figure 9:
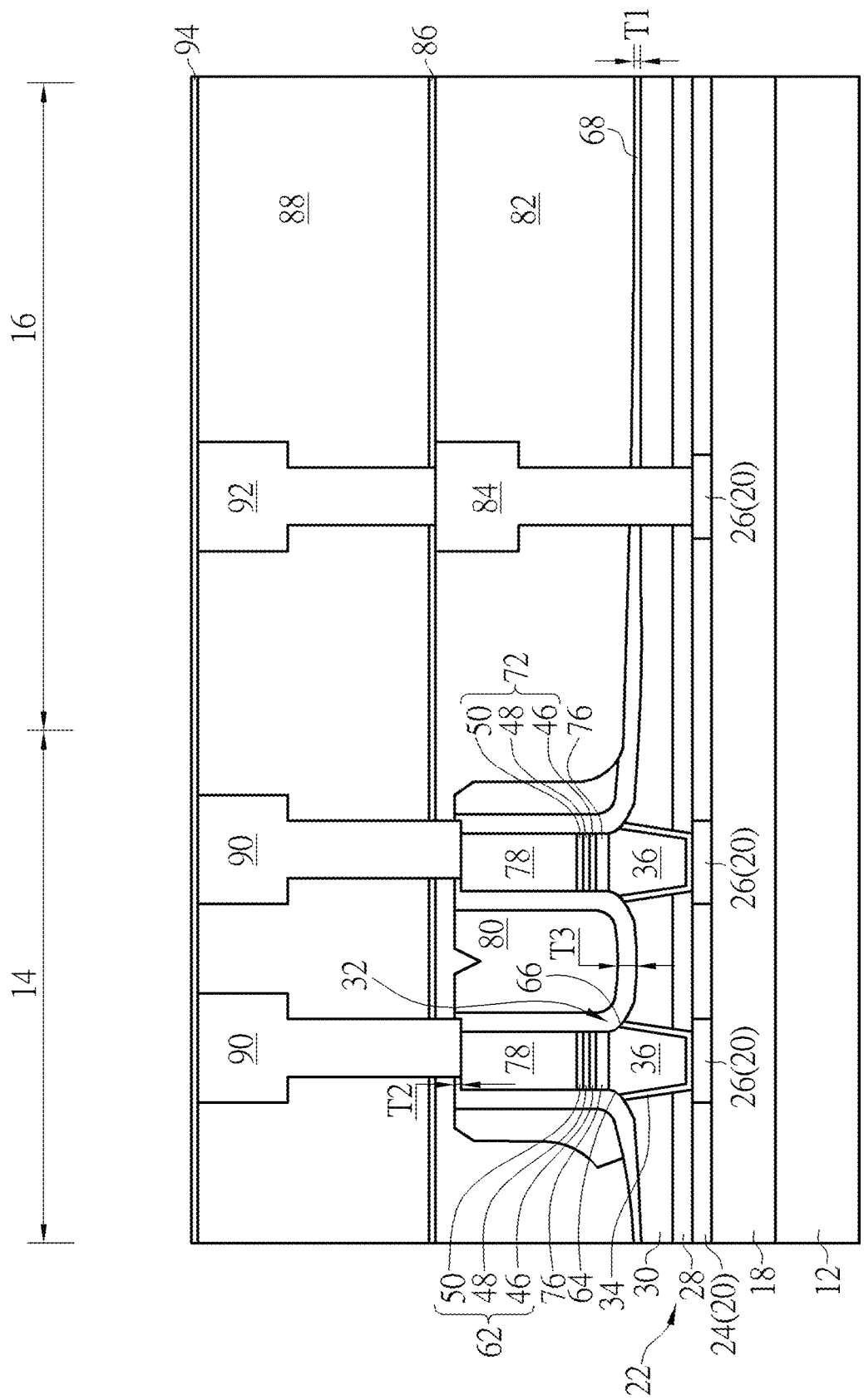

Referring to FIGS. 8-9, FIGS. 8-9 illustrate a method for fabricating semiconductor device according to an embodiment of the present invention. As shown in FIG. 8, it would be desirable to first conduct the aforementioned process in FIGS. 1-5 by using an etching back process to remove part of the passivation layer 80 so that the top surface of the remaining passivation layer 80 is even with the top surface of the cap layer 68, form an IMD layer 82 on the MTJ region 14 and logic region 16, and then conduct a planarizing process such as CMP to remove part of the IMD layer 82. It should be noted that in contrast to conduct the CMP process in FIG. 6 for removing part of the IMD layer 82 so that the top surface of the remaining IMD layer 82 is substantially even with the top surfaces of the passivation layer 80 and cap layer 68, the present embodiment preferably conducts the CMP process to remove part of the IMD layer 82 while controlling the remaining heights between the IMD layer 82 and the passivation layer 80 so that the top surface of the IMD layer 82 is slightly higher than the top surfaces of the passivation layer 80 and the cap layer 68.

Next, a pattern transfer process is conducted by using a patterned mask (not shown) to remove part of the IMD layer 82, part of the cap layer 68, part of the IMD layer 30, and part of the stop layer 28 on the logic region 16 to form a contact hole (not shown) exposing the metal interconnection 26 underneath and conductive materials are deposited into the contact hole afterwards. For instance, a barrier layer selected from the group consisting of titanium (Ti), titanium nitride (TiN), tantalum (Ta), and tantalum nitride (TaN) and metal layer selected from the group consisting of tungsten (W), copper (Cu), aluminum (Al), titanium aluminide (TiAl), and cobalt tungsten phosphide (CoWP) could be deposited into the contact hole, and a planarizing process such as CMP could be conducted to remove part of the conductive materials including the aforementioned barrier layer and metal layer to form a contact plug or metal interconnection 84 in the contact hole electrically connecting the metal interconnection 26.

Next, as shown in FIG. 9, a stop layer 86 and another IMD layer 88 are formed on the MTJs 62, 72 to cover the surface of the IMD layer 82, and one or more photo-etching process is conducted to remove part of the IMD layer 88, part of the stop layer 86, and even part of the cap layer 68 on the MTJ region 14 and part of the IMD layer 88 and part of the stop layer 86 on the logic region 16 to form contact holes (not shown). Next, conductive materials are deposited into each of the contact holes and a planarizing process such as CMP is conducted to form metal interconnections 90, 92 directly connecting the top electrodes 78 and metal interconnection 84 underneath, in which the metal interconnection 90 on the MTJ region 14 directly contacts the top electrodes 78 underneath while the metal interconnection 92 on the logic region 16 directly contacts the metal interconnection 84 on the lower level. Next, another stop layer 94 is formed on the IMD layer 88 to cover the metal interconnections 90, 92.

Referring to FIG. 9, FIG. 9 further illustrates a structural view of a semiconductor device according to an embodiment of the present invention. As shown in FIG. 9, the semiconductor device preferably includes MTJs 62, 72 disposed on the MTJ region 14, a metal interconnection 84 disposed on the logic region 16, metal interconnections 32 disposed directly under the MTJs 62, 72, an IMD layer 30 disposed around the metal interconnections 32, a cap layer 68 extending from on a sidewall of the MTJ 72 to a sidewall of the metal interconnection 84, a passivation layer 80 on the cap layer 68 and surrounding the MTJs 62, 72, an IMD layer 82 disposed on the cap layer 68 and surround the passivation layer 80, another IMD layer 88 disposed on the IMD layer 82, and metal interconnections 90, 92 disposed in the IMD layer 88 to electrically connect the top electrodes 78 and metal interconnection 84 underneath.

In this embodiment, the top surface of the IMD layer 82 is even with the top surface of the metal interconnection 84, the top surface of the cap layer 68 directly on top of the electrodes 78 is lower than the top surface of the IMD layer 82, the top surface of the passivation layer 80 is lower than the top surface of the IMD layer 82, the top surfaces of the cap layer 68 and passivation layer 80 are coplanar, and the IMD layer 82 contacts the top surfaces of the cap layer 68 and passivation layer 80 directly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
    a substrate comprising a magnetic tunneling junction (MTJ) region and a logic region;
    a first MTJ on the MTJ region;
    a first metal interconnection on the logic region;
    a cap layer extending from a sidewall of the first MTJ to a sidewall of the first metal interconnection; and
    a passivation layer around the first MTJ and the second MTJ, wherein the passivation layer between the first MTJ and the second MTJ comprises a V-shape.

2. The semiconductor device of claim 1, further comprising:
    a first inter-metal dielectric (IMD) layer on the substrate;
    a second metal interconnection and a third metal interconnection on the MTJ region, wherein the first MTJ is on the second metal interconnection and a second MTJ is on the third metal interconnection.

3. The semiconductor device of claim 2, wherein the cap layer on the first IMD layer between the first MTJ and the second MTJ and the cap layer on the logic region comprise different thicknesses.

4. The semiconductor device of claim 3, wherein a thickness of the cap layer on the first IMD layer on the logic region is less than a thickness of the cap layer on the first IMD layer between the first MTJ and the second MTJ.

5. The semiconductor device of claim 1, further comprising a second IMD layer on the cap layer around the passivation layer.

6. The semiconductor device of claim 5, wherein top surfaces of the second IMD layer and the passivation layer are coplanar.

7. The semiconductor device of claim 5, wherein top surfaces of the second IMD layer and the first metal interconnection are coplanar.

8. The semiconductor device of claim 1, wherein a thickness of the cap layer on the logic region is less than a thickness of the cap layer on the MTJ region.

* * * * *